(12) United States Patent
Watanabe et al.

(10) Patent No.: US 7,247,381 B1
(45) Date of Patent: Jul. 24, 2007

(54) ADHESIVE FOR BONDING CIRCUIT MEMBERS, CIRCUIT BOARD, AND METHOD OF PRODUCING THE SAME

(75) Inventors: Itsuo Watanabe, Shimodate (JP); Kenzo Takemura, Yuki (JP); Akira Nagai, Tsukuba (JP); Kazuhiro Isaka, Tsukuba (JP); Osamu Watanabe, Tsukuba (JP); Kazuyoshi Kojima, Tsukuba (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 0 days.

(21) Appl. No.: 09/762,823

(22) PCT Filed: Aug. 13, 1998

(86) PCT No.: PCT/JP98/03609

§ 371 (c)(1),
(2), (4) Date: Apr. 23, 2001

(87) PCT Pub. No.: WO00/09623

PCT Pub. Date: Feb. 24, 2000

(51) Int. Cl.
*B32B 27/38* (2006.01)
(52) U.S. Cl. .............. 428/413; 428/414; 428/500
(58) Field of Classification Search ............. 428/413, 428/414, 450
See application file for complete search history.

(56) References Cited

U.S. PATENT DOCUMENTS

| | | | | |
|---|---|---|---|---|
| 6,034,331 A | * | 3/2000 | Tsukagoshi et al. | 174/250 |
| 6,090,468 A | * | 7/2000 | Shimada et al. | 428/137 |
| 6,328,844 B1 | * | 12/2001 | Watanabe et al. | 156/330 |
| 6,338,195 B1 | * | 1/2002 | Tsukagoshi et al. | 29/832 |

FOREIGN PATENT DOCUMENTS

| | | |
|---|---|---|
| EP | 0 824 270 | 2/1998 |
| EP | 1 120 449 | 8/2001 |
| JP | 51-021192 | 2/1976 |
| JP | 62-051111 | 3/1987 |
| JP | 1-236588 | 9/1989 |
| JP | 4-118873 | 4/1992 |
| JP | 6-260533 | 9/1994 |
| JP | 6-349339 | 12/1994 |
| JP | 08-003529 | 1/1996 |
| JP | 8-003529 | 1/1996 |
| JP | 10-163254 | 6/1998 |
| WO | WO98/03047 | * 1/1998 |

OTHER PUBLICATIONS

Database WPI, Section EI, Week 199917, Derwent Publications Ltd., London, GB; AN 1999-202973, XP002210816 & KR 98 013 552 A (Hitachi, Chem Co Ltd), Apr. 30, 1998, *abstract*.
Communication and European Search Report mailed Jul. 26, 2004 for No. EP 04 01 3449.
Database WPI, Section EI, Week 199917, Derwent Publications, Ltd., AN 1999-202973, XP-002288702, Abstract only.
Chinese Office Action for corresponding Chinese Patent Application No. 98814271.6, dated Jun. 29, 2004.

* cited by examiner

*Primary Examiner*—Edward J. Cain
(74) *Attorney, Agent, or Firm*—Antonelli, Terry, Stout & Kraus, LLP.

(57) ABSTRACT

An adhesive for bonding and securing a semiconductor chip to a circuit board and electrically connecting the electrodes of the two, and containing 100 parts by weight of an adhesive resin composition and 10 to 200 parts by weight of an adhesive resin composition and 10 to 200 parts by weight of an inorganic filler, a circuit board in which the circuit members are bonded together with the adhesive, and a method of producing the circuit board.

17 Claims, 1 Drawing Sheet

ADHESIVE FOR BONDING CIRCUIT MEMBERS, CIRCUIT BOARD, AND METHOD OF PRODUCING THE SAME

TECHNICAL FIELD

This invention relates to an adhesive for bonding circuit members which is used to bond and fix a semiconductor chip to a substrate by, e.g., flip-chip mounting and also to electrically interconnect electrodes of the both. It also relates to a circuit board having circuit members bonded to one another, and a process for producing the circuit board.

BACKGROUND ART

In the field of semiconductor mounting, flip-chip mounting by which IC (integrated circuits) are directly mounted on a printed substrate or a flexible wiring board attracts notice as a new mounting form adaptable to achievement of lower cost and higher precision.

As methods for such flip-chip mounting, known are a method in which solder bumps are provided at terminals of a chip to effect solder bonding and a method in which electrical interconnection is made via a conductive adhesive. These methods have a problem that a stress due to a difference in coefficient of thermal expansion between the chip and the substrate that are to be bonded to each other may be generated to lower connection reliability when products are exposed to environment of various types. Accordingly, a method has come to be commonly studied in which an underfill material of an epoxy resin type is injected into a chip-/substrate gap in order to relax the stress at the bonding interface.

There, however, is another problem that the step of injecting such an underfill makes a process complicate to bring about a disadvantage in view of productivity and cost. To solve such a problem, what recently attracts notice from the viewpoint of process simplicity is flip-chip mounting that makes use of an anisotropic conductive adhesive having both anisotropic conductivity and encapsulation function.

However, where a chip is directly mounted on a substrate via the anisotropic conductive adhesive, the stress due to a difference in coefficient of thermal expansion between the chip and the substrate may be generated in a temperature cycle test. This brings about a problem that the adhesive may cause an increase in connection resistance or separation at adhesive layers when reliability tests such as a thermal shock test, a PCT (pressure cooker test) and a solder bath immersion test are made. Also, where projected electrodes are formed at connecting terminals of a chip, there is a problem that the stress due to a difference in coefficient of thermal expansion between the chip and the substrate may concentrate at the interface between the projected electrodes and the chip in the reliability tests, making the projected electrodes separate from their interface with chip electrodes to cause faulty conduction.

DISCLOSURE OF THE INVENTION

The present invention provides an adhesive for bonding circuit members that does hardly cause any increase in connection resistance or separation at adhesive layers to bring about a great improvement in connection reliability, and provides a circuit board having circuit members bonded to one another, and a process for producing the circuit board.

A first adhesive for bonding circuit members according to the present invention is an adhesive for bonding circuit members which is to be put between circuit electrodes facing each other; the circuit electrodes facing each other being pressed interposing the adhesive between them, to interconnect the electrodes electrically in the direction of pressing;

the adhesive comprising an adhesive resin composition and an inorganic filler; the inorganic filler being contained in an amount of from 10 to 200 parts by weight based on 100 parts by weight of the adhesive resin composition.

A second adhesive for bonding circuit members according to the present invention is an adhesive for bonding circuit members which is to be put between circuit electrodes facing each other; the circuit electrodes facing each other being pressed interposing the adhesive between them, to interconnect the electrodes electrically in the direction of pressing;

the adhesive being in multi-layer constitution having a first adhesive layer comprising an adhesive resin composition and an inorganic filler and containing the inorganic filler in an amount of from 10 to 200 parts by weight based on 100 parts by weight of the adhesive resin composition, and a second adhesive layer containing an adhesive resin composition as a main ingredient.

A third adhesive for bonding circuit members according to the present invention is an adhesive for bonding circuit members which is to be put between circuit electrodes facing each other; the circuit electrodes facing each other being pressed interposing the adhesive between them, to interconnect the electrodes electrically in the direction of pressing;

the adhesive comprising an adhesive resin composition and an inorganic filler and having an average coefficient of thermal expansion of 200 ppm/° C. or below at 110 to 130° C. after curing. It may preferably have an average coefficient of thermal expansion of from 30 to 200 ppm/° C. at 110 to 130° C. after curing.

A fourth adhesive for bonding circuit members according to the present invention is an adhesive for bonding circuit members which is to be put between circuit electrodes facing each other; the circuit electrodes facing each other being pressed interposing the adhesive between them, to interconnect the electrodes electrically in the direction of pressing;

the adhesive being in multi-layer constitution having a third adhesive layer and a fourth adhesive layer which have physical properties different in value from each other.

The above adhesive may preferably have a modulus of elasticity after curing which is higher in the third adhesive layer than in the fourth adhesive layer, and the fourth adhesive layer has a modulus of elasticity of from 100 to 2,000 MPa at 40° C. after curing.

The adhesive may also preferably have a coefficient of thermal expansion which is smaller in the third adhesive layer than in the fourth adhesive layer, and the third adhesive layer has a coefficient of thermal expansion at 30 to 100° C., of from 20 to 70 ppm/° C.

The adhesive may preferably have a glass transition temperature that is higher in the third adhesive layer than in the fourth adhesive layer, and the third adhesive layer has a glass transition temperature of 120° C. or above.

At least one layer of the third and fourth adhesive layers may contain the inorganic filler in an amount of from 10 to 200 parts by weight based on 100 parts by weight of the adhesive resin composition.

The adhesive may contain conductive particles in an amount of from 0.1 to 30 parts by volume based on 100 parts by volume of the adhesive resin composition.

The adhesive may preferably have a modulus of elasticity of from 30 to 2,000 MPa at 40° C. after the curing of the adhesive resin composition.

The adhesive resin composition may contain an epoxy resin, an acrylic rubber and a latent curing agent. The acrylic rubber may preferably be an acrylic rubber containing a glycidyl ether group in its molecule.

The adhesive may have the form of a film.

The circuit board of the present invention comprises;

a first circuit member having first connecting terminals; and a second circuit member having second connecting terminals;

the first connecting terminal and the second connecting terminal being disposed facing each other, and an adhesive being put between the first connecting terminal and the second connecting terminal which are disposed facing each other; and the first connecting terminal and the second connecting terminal disposed facing each other being electrically interconnected by pressing with heating;

the adhesive being the adhesive for bonding circuit members according to the present invention.

Where the first circuit member having first connecting terminals is an inorganic insulating substrate having first connecting terminals and the second circuit member having second connecting terminals is an organic insulating substrate having second connecting terminals, the first adhesive layer or the third adhesive layer of the adhesive having multi-layer constitution stands adhered on the side of the first circuit member.

The adhesive for bonding circuit members according to the present invention is an adhesive for bonding circuit members which is to be put between circuit electrodes facing each other; the circuit electrodes facing each other being pressed interposing the adhesive between them, to interconnect the electrodes electrically in the direction of pressing;

the adhesive comprising an adhesive resin composition and an inorganic filler; the inorganic filler being contained in an amount of from 10 to 200 parts by weight based on 100 parts by weight of the adhesive resin composition; or the adhesive being in multi-layer constitution having a first adhesive layer containing the inorganic filler in an amount of from 10 to 200 parts by weight based on 100 parts by weight of the adhesive resin composition and a second adhesive layer containing an adhesive resin composition as a major constituent. In such an adhesive for bonding circuit members according to the present invention, in which the inorganic filler is contained in an amount of from 10 to 200 parts by weight based on 100 parts by weight of the adhesive resin composition, the adhesive resin composition may preferably be a composition having a modulus of elasticity of from 30 to 2,000 MPa at 40° C. after curing. Here, the adhesive may have a modulus of elasticity at 40° C. of from 100 to 5,000 MPa, and preferably higher than 2,000 MPa and not higher than 3,500 MPa.

An adhesive containing the adhesive resin composition having a modulus of elasticity of from 30 to 2,000 MPa at 40° C. after curing and containing the inorganic filler to have a modulus of elasticity at 40° C. which is higher than 2,000 MPa can relax its stress on account of the adhesive resin composition having a low modulus of elasticity and also can make its coefficient of thermal expansion small on account of the inorganic filler, making it possible to provide an adhesive for bonding circuit members which has a superior connection reliability.

The second adhesive layer containing an adhesive resin composition as a main ingredient may preferably contain no inorganic filler. However, in order to control properties, it may contain the inorganic filler in an amount smaller than that in the first adhesive layer, e.g., less than 50% by weight, and preferably less than 20% by weight.

The second adhesive layer containing an adhesive resin composition as a main ingredient may be an adhesive layer having a modulus of elasticity at 40° C. of from 100 to 2,000 MPa.

The adhesive having multi-layer constitution as used in the present invention may preferably be provided in accordance with the magnitude of the modulus of elasticity or coefficient of thermal expansion of circuit members to be bonded to each other. More specifically, the adhesive may preferably be so provided that the third adhesive layer side having relatively a higher modulus of elasticity or smaller coefficient of thermal expansion or higher glass transition temperature is applied on the side of a circuit member having relatively a higher modulus of elasticity or smaller coefficient of thermal expansion, and the fourth adhesive layer side having relatively a lower modulus of elasticity or larger coefficient of thermal expansion or lower glass transition temperature is applied on the side of a circuit member having relatively a lower modulus of elasticity or larger coefficient of thermal expansion.

In the adhesive having multi-layer constitution as used in the present invention, when, e.g., a semiconductor chip and an organic insulating substrate are bonded to each other, the fourth adhesive layer, constituting the face on the side of the organic insulating substrate, may preferably have a modulus of elasticity of from 100 to 2,000 MPa at 40° C. after curing, for the purpose of relieving the stress due to a difference in coefficient of thermal expansion between the chip and the organic insulating substrate. The third adhesive layer, constituting the face on the side of the semiconductor chip, may have a modulus of elasticity of from 500 to 5,000 MPa at 40° C. after curing, which is higher than that of the fourth adhesive layer.

For the purpose of relieving the stress due to a difference in coefficient of thermal expansion between the chip and the organic insulating substrate, the third adhesive layer constituting the face on the side of the semiconductor chip may preferably have a coefficient of thermal expansion at 30 to 100° C., of from 20 to 70 ppm/° C., and the fourth adhesive layer constituting the face on the side of the organic insulating substrate may preferably have a coefficient of thermal expansion at 30 to 100° C., of from 30 to 100 ppm/° C., which is larger than that of the third adhesive layer.

For the purpose of relieving the stress due to a difference in coefficient of thermal expansion between the chip and the organic insulating substrate, the third adhesive layer constituting the face on the side of the semiconductor chip may preferably have a glass transition temperature of 120° C. or higher and also 180° C. or lower, and the fourth adhesive layer constituting the face on the side of the organic insulating substrate may preferably have a glass transition temperature lower than that of the third adhesive layer.

At least one layer of the third and fourth adhesive layers may contain the inorganic filler.

The coefficient of thermal expansion and glass transition temperature of an adhesive film cured product corresponding to a stage after the adhesive has been applied may be measured with, e.g., a thermomechanical tester TM-7000 (tensile mode; load: 5 gf; heating rate: 5° C./minute), manufactured by Shinku-Riko Inc. Here, the adhesive film is cured under the same conditions as heating temperature and time in the step of bonding. The curing of the adhesive film may be effected by immersing it in an oil bath. Such an adhesive film cured product is a product in which 90% or more of heat of the total curing exotherm has been liberated in the measurement with a DSC (differential scanning calorimeter).

As the adhesive resin composition used in the present invention, usable is a mixture of an epoxy resin with any of latent curing agents such as imidazole types, hydrazide types, boron trifluoride-amine complexes, sulfonium salts, amine-imides, polyamine salts and dicyandiamide. In order to relax the stress due to a difference in coefficient of thermal expansion between circuit members, preferred is an adhesive resin composition having a modulus of elasticity of from 30 to 2,000 MPa at 40° C. after curing.

For example, as an adhesive resin composition that can achieve good flow properties and high connection reliability at the time of bonding, preferred are those prepared by mixing an acrylic rubber in the mixture of an epoxy resin with any of latent curing agents such as imidazole types, hydrazide types, boron trifluoride-amine complexes, sulfonium salts, amine-imides, polyamine salts and dicyandiamide, so mixing them as to provide the modulus of elasticity of from 30 to 2,000 MPa at 40° C. after curing.

The modulus of elasticity of an adhesive resin composition cured product corresponding to a stage after the adhesive resin composition has been applied may be measured by the DVE method using, e.g., RHEOSPECTRA DVE-4 (tensile mode; frequency: 10 Hz; heating rate: 5° C./minute; measured at −40° C. up to 250° C.), manufactured by Rheology Co.). Here, the adhesive resin composition is cured under the same conditions as heating temperature and time in the step of bonding. The curing of the adhesive resin composition film may be effected by immersing it in an oil bath. Such an adhesive resin composition film cured product is a product in which 90% or more of heat of the total curing exotherm has been liberated in the measurement with the DSC.

The epoxy resin may include bisphenol type epoxy resins derived from epichlorohydrin and bisphenol A, F, AD or the like; epoxy novolak resins derived from epichlorohydrin and phenol novolak or cresol novolak; naphthalene type epoxy resins having a skeleton containing a naphthalene ring; and epoxy compounds having at least two glycidyl groups in the molecule, such as glycidyl amine, glycidyl ether, biphenyl and alicyclics; any of which may be used alone or in combination of two or more types. As these epoxy resins, in order to prevent electron migration it is preferable to use high-purity products in which impurity ions (such as $Na^+$ and $Cl^-$), hydrolyzable chlorine and so forth have been reduced to 300 ppm or less.

The epoxy resin may preferably be a trifunctional or higher polyfunctional epoxy resin and/or a naphthalene type epoxy resin in order to ensure a low coefficient of thermal expansion and a high glass transition temperature. The trifunctional or higher polyfunctional epoxy resin may include phenol novolak type epoxy resins, cresol novolak type epoxy resins, trishydroxyphenylmethane type epoxy resins, tetraphenylolethane type epoxy resins, and dicyclopentadiene phenol type epoxy resins. In addition, the naphthalene type epoxy resin has a structure containing at least one naphthalene ring in one molecule, and may include naphthol types and naphthalenediol types.

The acrylic rubber may include polymers or copolymers having as a monomer component at least one of acrylic acid, acrylate, methacrylate and acrylonitrile. In particular, copolymer type acrylic rubbers containing glycidyl acrylate or glycidyl methacrylate having a glycidyl ether group may preferably be used.

These acrylic rubbers may preferably be those having a molecular weight of 200,000 or more in view of improvement in cohesive force of the adhesive resin composition. If the acrylic rubber is mixed in an amount not more than 15% by weight in the adhesive resin composition, the composition may have a modulus of elasticity higher than 2,000 MPa at 40° C. after curing. If on the other hand it is in an amount more than 40% by weight, though a low modulus of elasticity is achievable, the composition may have so high a melt viscosity at the time of bonding that the molten adhesive may be low removable at the interface to make it impossible to ensure electrical conduction between electrodes interconnected or between electrodes interconnected and conductive particles. Accordingly, the acrylic rubber may preferably be mixed in an amount of from 15 to 40% by weight. These acrylic rubbers mixed in the adhesive resin composition have a peak temperature at about 40 to 60° C., of dielectric dissipation factor due to the rubber component, and hence the adhesive composition can be made to have a low modulus of elasticity.

The adhesive resin composition may preferably have a modulus of elasticity of from 30 to 2,000 MPa at 40° C. after curing. The adhesive may have a modulus of elasticity of from 100 to 5,000 MPa at 40° C. after curing, and may have one higher than 2,000.

A thermoplastic resin such as a phenoxy resin may also be mixed in the adhesive in order to more improve film-forming properties. In particular, the phenoxy resin is preferred because it has characteristic features that, e.g., it is structurally similar to the epoxy resin and hence has good compatibility with, and adhesion to, the epoxy resin. To form film, an adhesive composition comprised of at least these epoxy resin, acrylic rubber, phenoxy resin and latent curing agent and conductive particles may be dissolved or dispersed in an organic solvent to prepare a liquid material, which may then be coated on the surface of a film-releasable substrate, followed by removal of the solvent at a temperature lower than the curing-agent activation temperature. The solvent used here may preferably be a mixed solvent of an aromatic hydrocarbon type solvent and an oxygen-containing solvent in order to improve solubility of materials.

The inorganic filler used in the present invention may include, but not particularly limited to, e.g., powders of fused silica, crystalline silica, calcium silicate, alumina, calcium carbonate and the like. The inorganic filler may be mixed in an amount of from 10 to 200 parts by weight based on 100 parts by weight of the adhesive resin composition. The more the filler is mixed, the more effective it is to ensure a low coefficient of thermal expansion. However, its mixing in a large quantity may cause faulty conduction because the adhesive may have a low adhesion or may be low removable at the bonding part. If it is mixed in a small quantity, any low coefficient of thermal expansion may be ensured. Accordingly, it may preferably be mixed in an amount of from 20 to 90 parts by weight. In addition, it may have an average particle diameter smaller than 3 µm so that any faulty conduction at the bonding part can be prevented. In addition, for the purpose of preventing resin flowability from lowering and chip's passivation film from being damaged at the time of bonding, it is preferable to use a spherical filler.

In the adhesive of the present invention, conductive particles may be mixed and dispersed for the purpose of intentionally providing anisotropic conductivity in order to assimilate any uneven height of chip bumps or substrate electrodes. In the present invention, the conductive particles may be particles of metals as exemplified by Au, Ag, Cu and solder, and may preferably be those comprising spherical core materials of polymers such as polystyrene provided thereon with conductive layers of Ni, Cu, Au, solder or the like. In addition, surface layers of Su, Au, solder or the like may be formed on the surfaces of conductive particles. Such particles must have a particle diameter that is smaller than the minimum gap of substrate electrodes. Where the electrodes have uneven height, the particles may preferably have a particle diameter that is larger than the uneven height, and preferably from 1 to 10 μm. In addition, the conductive particles may be dispersed in the adhesive in an amount of from 0.1 to 30 parts by volume, and preferably from 0.2 to 15 parts by volume, based on 100 parts by volume of the adhesive resin composition.

The adhesive of the present invention may be used as a film adhesive.

To obtain the film adhesive, an adhesive composition comprised of the epoxy resin, acrylic rubber, latent curing agent and so forth may be dissolved or dispersed in an organic solvent to prepare a liquid material, which may then be coated on the surface of a film-releasable substrate, followed by removal of the solvent at a temperature lower than the curing-agent activation temperature.

A film adhesive having multi-layer constitution may be obtained by a method in which a first or third film adhesive and a second or fourth film adhesive may individually be formed by coating on the surface of a separator film (film-releasable substrate) comprised of polyethylene terephthalate, fluorine type resin or the like and thereafter the first or third film adhesive and the second or fourth film adhesive are laminated by pressing or by pressing and simultaneously heating to obtain a film adhesive comprised of the first or third film adhesive and the second or fourth film adhesive, or a method in which the first or third film adhesive (or the second or fourth film adhesive) is formed on the surface of the separator film and further thereon the second or fourth film adhesive (or the first or third film adhesive) is superposingly formed by coating to obtain a film adhesive comprised of the first or third film adhesive and the second or fourth film adhesive.

The film adhesive obtained by lamination of the first or third film adhesive and the second or fourth film adhesive may preferably be in a thickness of from 20 to 120 μm in total. The first or third film adhesive and the second or fourth film adhesive may individually preferably be in a thickness ratio in the range of first or third film adhesive: second or fourth film adhesive=1:9 to 9:1. Especially when semiconductor chips are bonded to an organic insulating substrate, the ratio may preferably be in the range of first or third film adhesive: second or fourth film adhesive=3:7 to 7:3.

The film adhesive may preferably have a layer thickness larger than the gap between the first and the second circuit members, and should commonly have a layer thickness larger by at least 5 μm than the gap.

In the present invention, as the circuit members, usable are chip component parts such as semiconductor chips, resistor chips and capacitor chips, printed substrates, and flexible wiring boards comprised of polyimide or polyester as a base material.

The chip component parts comprise a non-metallic inorganic insulating substrate such as silicon, glass, ceramic or compound semiconductor substrate and formed thereon a large number of connecting terminals. The printed substrates and the flexible wiring boards comprised of polyimide or polyester as a base material comprise an organic insulating substrate and formed thereon a large number of connecting terminals.

As a substrate on which the chip component parts are mounted, an organic insulating substrate having electrodes (connecting terminals) formed correspondingly to semiconductor chip terminals may be used.

As the organic insulating substrate, usable are a synthetic-resin film of polyimide resin, polyester resin or the like, and a laminated sheet obtained by impregnating a glass substrate such as glass cloth or glass nonwoven fabric with a resin such as polyimide resin, epoxy resin or phenol resin, followed by curing.

A multi-layer wiring board may be used which has electrodes to be connected to chip terminals, a surface insulating layer having these terminals formed thereon, a given number of insulating layers, a given number of wiring layers provided between the respective insulating layers, and holes having been made conductive through which the electrodes and the wiring layers are electrically interconnected.

Such a multi-layer wiring board may preferably be a built-up multi-layer substrate obtained by forming insulating layers and conductive circuit layers alternately on the surface of a base material having an insulating layer formed using glass cloth or on the surface of a wiring substrate having at least one conductor circuit.

As the surface insulating layer, a resin film may be used. As this resin film, usable are films of epoxy resins, polyimide resins, polyamide-imide resins, modified polyphenylene ether resins, phenoxy resins, amide-epoxy resins or phenolic resins, or mixtures, copolymers or the like of any of these; and films of heat-resistant thermoplastic engineering plastics such as polysulfone, polyether sulfone, polyether ether ketone, totally aromatic liquid-crystal polyesters, and fluorine resins. Resin films in which an organic or inorganic filler is contained may be used. As insulating layers formed of resins reinforced with a glass base material, prepregs may be used which are obtained by impregnating a glass substrate such as glass cloth or glass nonwoven fabric with a resin such as epoxy resin or phenol resin, followed by curing.

The circuit members are provided with connecting terminals that are usually in a large number (or may be single in some cases). At least one set of the circuit members is so disposed that at least some of the connecting terminals provided on these circuit members face each other, and the adhesive is put between the connecting terminals disposed facing each other, followed by pressing with heating to electrically interconnect the connecting terminals disposed facing each other, to make up a circuit board.

At least one set of circuit members is pressed with heating, whereupon the connecting terminals disposed facing each other are electrically interconnected by direct contact or via the conductive particles of the anisotropic conductive adhesive.

On electrode pads of the semiconductor chip or substrate, bumps formed by plating and tips of gold wires may be melted by means of a torch or the like to form gold balls, and these balls may be contact-bonded onto the electrode pads. Thereafter, projected electrodes such as wire bumps obtained by cutting wires may be provided so as to be used as the connecting terminals.

A process for producing the circuit board will be described taking the case of an instance in which a first circuit member comprised of an inorganic insulating substrate and a second circuit member comprised of an organic insulating substrate are bonded with a film adhesive.

A first circuit member comprised of an inorganic insulating substrate, having a first connecting terminal, and a second circuit member comprised of an organic insulating substrate, having a second connecting terminal, are disposed in such a way that the first connecting terminal and the second connecting terminal face each other, which are so disposed that the adhesive for bonding circuit members according to the present invention is put between the first connecting terminal and the second connecting terminal which have been disposed facing each other, in such a way that the first or third adhesive layer is on the side of the first circuit member, followed by pressing to electrically interconnect the first connecting terminal and the second connecting terminal disposed facing each other. Thus, the circuit board of the present invention can be produced.

Stated specifically, for example, firstly the surface of a film, second or fourth adhesive layer is brought into contact with the second circuit member to provisionally fix the film adhesive to the second circuit member. Subsequently, the electrodes of the first circuit member are registered on the electrodes of the second circuit member, where a load of 20 to 150 gf per electrode is applied from the part on the side of the first circuit member, during which heat is so applied for 10 to 20 seconds that the film adhesive is heated to 180 to 200° C. to cure the film adhesive. Thus, the electrodes of the first circuit member and the electrodes of the second circuit member are electrically interconnected and at the same time this state of connection between the first circuit member and the second circuit member is retained on account of the curing of the film adhesive.

An example in which a semiconductor chip is bonded to a mounting substrate will be described with reference to FIGS. 1 and 2. FIG. 1 shows an example in which a semiconductor chip is bonded to a mounting substrate by means of an adhesive not containing any conductive particles. FIG. 2 shows a bonded portion where a semiconductor chip is bonded to a mounting substrate by means of an adhesive containing conductive particles.

An electronic component device shown in FIG. 1 is constituted of a mounting substrate 20 and a semiconductor chip 10 mounted thereon. Incidentally, FIG. 1 shows part of the electronic component device. Actually, other component parts such as other semiconductor chips are mounted on the mounting substrate 20.

On the semiconductor chip 10, projected electrodes (bumps) serving as connecting electrodes 11 are formed on its one face. The chip is electrically interconnected to the mounting substrate via the connecting electrodes 11.

The mounting substrate 20 has a plurality of insulating layers 21 and 22, a plurality of wiring layers 32 and 33 disposed via the insulating layers 21 and 22, connecting electrode terminals 31 for making connection with the connecting electrodes 11 of the semiconductor chip 10, and a conductor 34 provided through the insulating layers 21 and 22 to electrically interconnect wiring layers specified among the wiring layers 32 and 33. In order to pass the conductor 34 through the insulating layers, the insulating layers 21 and 22 are provided, at their necessary spots, with holes 25 for serving as through-holes. More specifically, this mounting substrate constitutes a resin composite type multi-layer wiring board. Here, the wiring layers 32 are provided as an inner-layer circuit, and the wiring layers 33 are provided as an outer-layer circuit. The connecting electrode terminals 31 function as a conductor circuit on which the chip is to be mounted.

The projected electrodes (bumps) which are connecting electrodes 11 provided on the semiconductor chip 10 are registered on the connecting electrode terminals 31 provided on the surface of the mounting substrate 20. A film adhesive 40 for bonding has been disposed between the semiconductor chip 10 and the mounting substrate 20. In this state, pressure and heat are applied from the part on the side of the semiconductor chip 10, whereby the adhesive 40 come to flow and then cure, so that the connecting electrodes 11 provided on the semiconductor chip 10 and the connecting electrode terminals 31 provided on the surface of the mounting substrate 20 come into direct mechanical contact to attain electrical interconnection.

Where an adhesive 40 such as an anisotropic conductive adhesive having conductive particles 41 is used, as shown in FIG. 2 the connecting electrodes 11 are connected to the connecting electrode terminals 31 in the state the conductive particles 41 are interposed between them, and simultaneously bonded and fixed there. In the case when the anisotropic conductive adhesive 40 is used and in the state where electrode surfaces facing each other to be bonded are brought into pressure contact, the conduction between the electrodes facing each other is effected via the conductive particles interposed between them. In addition, between adjacent electrodes, the adhesive, though containing conductive particles, has the conductive particles in a low density and hence exhibits no conductivity.

The mounting substrate 20 has at least one first insulating layer 21 formed of a resin reinforced with a glass base material, and a second insulating layer 22 which constitutes one layer at least on the side on which the electronic component parts are bonded and fixed. Incidentally, in the example shown in FIG. 1, the second insulating layer 22 is also provided on the side different from the side on which the electronic component parts are bonded and fixed.

According to the adhesive of the present invention, any stress at the interface between the semiconductor chip and the adhesive for bonding circuit members can be relaxed, and besides, in the case when it has a modulus of elasticity of from 30 to 2,000 MPa at 40° C. as the adhesive resin composition, the stress generated in reliability tests such as the thermal shock test, PCT or solder bath immersion test can also be absorbed by the adhesive resin composition. Hence, the adhesive may cause neither increase in connection resistance at bonded portions nor separation at adhesive layers even after the reliability tests, bringing about a great improvement in connection reliability. The present invention makes it possible to provide a gradation of physical properties in the thickness direction of the adhesive for bonding circuit members, and hence the adhesive can absorb internal stress generated in the reliability tests such as the thermal shock test, PCT or solder bath immersion test. Thus, the adhesive may cause neither increase in connection resistance at bonded portions nor separation at adhesive layers even after the reliability tests, bringing about a great improvement in connection reliability. In addition, the film adhesive is convenient to handle.

Accordingly, the adhesive of the present invention may preferably be used to make electrical connection between LCD (liquid-crystal display) panels and TAB (tape automated bonding) substrates, TAB substrates and flexible circuit substrates, LCD panels and IC chips, and IC chips and printed wiring substrates only in the direction of pressing at the time of bonding.

The circuit board of the present invention can absorb the stress generated in the reliability tests, and may cause neither increase in connection resistance at bonded portions nor separation at adhesive layers even after the reliability tests, bringing about a great improvement in connection reliability. In addition, in the circuit board of the present invention, the film adhesive having a small coefficient of thermal expansion is used on the chip side and the stress generated at the interface between the chip and the adhesive can be relaxed. Thus, when the projected electrodes are provided on electrode pads of the chip, any separation of the projected electrodes from the electrode pads can be made greatly less occur.

BEST MODES FOR PRACTICING THE INVENTION

Example 1

Figure 1:
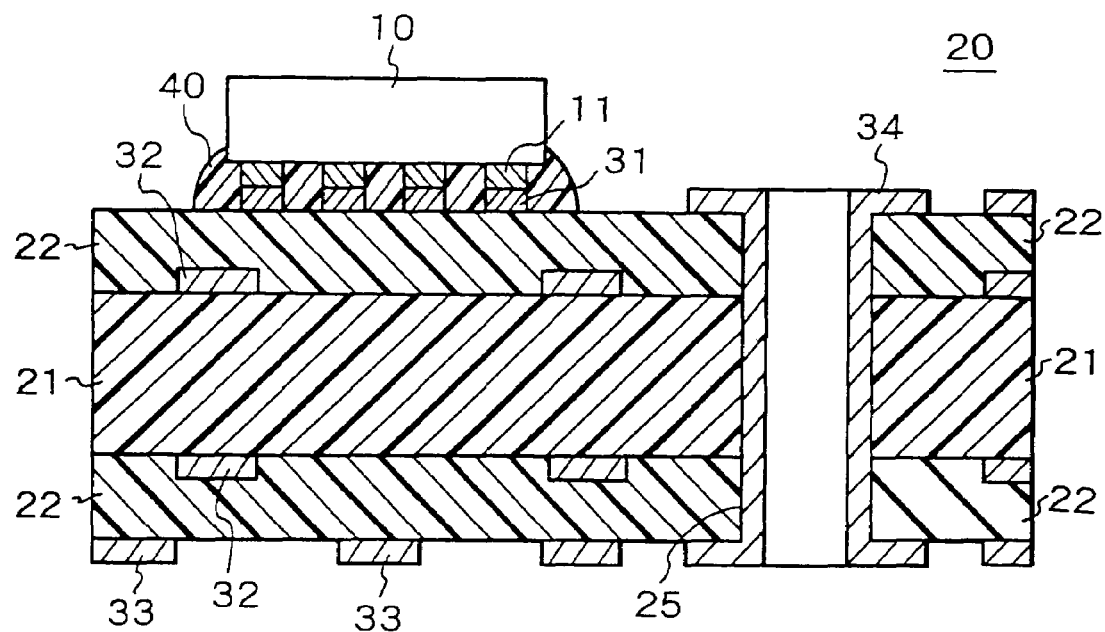
FIG. 1 is a cross-sectional illustration of an example of the construction of an electronic component device according to the present invention.
Figure 2:
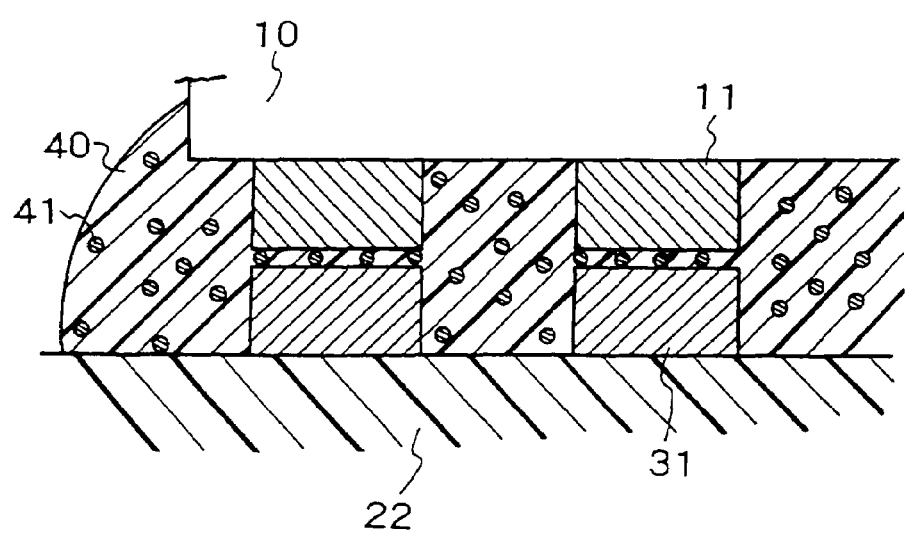
FIG. 2 is a cross-sectional illustration of an example of the state of connection between electronic component parts and a mounting substrate.

50 g of phenoxy resin and 125 g of acrylic rubber (molecular weight: 850,000) obtained by copolymerization of butyl acrylate (40 parts), ethyl acrylate (30 parts), acrylonitrile (30 parts) and glycidyl methacrylate (3 parts) were dissolved in 400 g of ethyl acetate to obtain a 30% solution.

Next, 325 g of liquid epoxy (epoxy equivalent weight: 185) containing a microcapsular latent curing agent was added to this solution, followed by stirring, where fused silica (average particle diameter: 0.5 µm) in an amount of 40 parts by weight based on 100 parts by weight of the adhesive resin composition and also 2% by volume of nickel particles (diameter: 3 µm) were dispersed to obtain a film coating fluid.

This film coating fluid was coated on a separator (silicone-treated polyethylene terephthalate film; thickness: 40 µm) by means of a roll coater, followed by drying at 100° C. for 10 minutes to form an adhesive film a of 45 µm thick. This adhesive film a had a modulus of elasticity at 40° C. of 800 MPa after curing as measured with a dynamic viscoelasticity measuring instrument on only an adhesive resin composition from which the fused silica and nickel particles were removed.

Next, using the adhesive film a thus obtained, a chip (10 mm×10 mm; thickness: 0.5 mm) with gold bumps (area: 80 µm×80 µm each; space: 30 µm; height: 15 µm; the number of bumps: 288) was bonded to a Ni/Au-plated Cu circuit printed substrate in the manner as shown below.

First, the adhesive film a (12 mm×12 mm) was stuck to the Ni/Au-plated Cu circuit printed substrate (electrode height: 20 µm; thickness: 0.8 mm) at 80° C. and 10 kgf/cm². Thereafter, the separator was peeled, and the bumps of the chip were registered on the Ni/Au-plated Cu circuit printed substrate (thickness: 0.8 mm). Then, heat and pressure were applied from above the chip under conditions of 180° C., 30 g/bump and 20 seconds to effect main bonding.

Connection resistance after the main bonding was 6 mΩ at maximum per bump and 2 mΩ on the average, and insulation resistance was $10^8$ Ω or above. These values did not change even after 1,000-cycle treatment in a thermal shock test made at −55 to 125° C., after a PCT (121° C., 2 atmospheric pressure) made for 200 hours, and after 260° C. solder bath immersion for 10 seconds, showing good connection reliability.

Example 2

50 g of phenoxy resin and 175 g of acrylic rubber (molecular weight: 850,000) obtained by copolymerization of butyl acrylate (40 parts), ethyl acrylate (30 parts), acrylonitrile (30 parts) and glycidyl methacrylate (3 parts) were dissolved in 525 g of ethyl acetate to obtain a 30% solution.

Next, 275 g of liquid epoxy (epoxy equivalent weight: 185) containing a microcapsular latent curing agent was added to this solution, followed by stirring, where fused silica (average particle diameter: 0.5 µm) in an amount of 60 parts by weight based on 100 parts by weight of the adhesive resin composition and also 2% by volume of nickel particles (diameter: 5 µm) were dispersed to obtain a film coating fluid.

This film coating fluid was coated on a separator (silicone-treated polyethylene terephthalate film; thickness: 40 µm) by means of a roll coater, followed by drying at 100° C. for 10 minutes to form an adhesive film b of 45 µm thick. This adhesive film b had a modulus of elasticity at 40° C. of 400 MPa after curing as measured with a dynamic viscoelasticity measuring instrument on only an adhesive resin composition from which the fused silica and nickel particles were removed.

Next, using the adhesive film b thus obtained, a chip (10 mm×10 mm) with gold bumps (area: 80 µm×80 µm each; space: 30 µm; height: 15 µm; the number of bumps: 288) was bonded to a Ni/Au-plated Cu circuit printed substrate (electrode height: 20 µm; thickness: 0.8 mm) in the manner as shown below.

First, the adhesive film b (12 mm×12 mm) was stuck to the Ni/Au-plated Cu circuit printed substrate at 80° C. and 10 kgf/cm². Thereafter, the separator was peeled, and the bumps of the chip were registered on the Ni/Au-plated Cu circuit printed substrate. Then, heat and pressure were applied from above the chip under conditions of 170° C., 30 g/bump and 20 seconds to effect main bonding.

Connection resistance after the main bonding was 18 mΩ at maximum per bump and 8 mΩ on the average, and insulation resistance was $10^8$ Ω or above. These values did not change even after 1,000-cycle treatment in a thermal shock test made at −55 to 125° C., after a PCT (121° C., 2 atmospheric pressure) made for 200 hours, and after 260° C. solder bath immersion for 10 seconds, showing good connection reliability.

Example 3

50 g of phenoxy resin and 100 g of acrylic rubber (molecular weight: 850,000) obtained by copolymerization of butyl acrylate (40 parts), ethyl acrylate (30 parts), acrylonitrile (30 parts) and glycidyl methacrylate (3 parts) were dissolved in 350 g of ethyl acetate to obtain a 30% solution.

Next, 350 g of liquid epoxy (epoxy equivalent weight: 185) containing a microcapsular latent curing agent was added to this solution, followed by stirring, where fused silica (average particle diameter: 0.5 µm) in an amount of 60 parts by weight based on 100 parts by weight of the adhesive resin composition and also 5% by volume of conductive particles obtained by forming Au layers on polystyrene cores (diameter: 5 µm) were dispersed to obtain a film coating fluid.

This film coating fluid was coated on a separator (silicone-treated polyethylene terephthalate film; thickness: 40 µm) by means of a roll coater, followed by drying at 100° C. for 10 minutes to form an adhesive film c of 45 µm thick. This adhesive film c had a modulus of elasticity at 40° C. of 1,000 MPa after curing as measured with a dynamic viscoelasticity measuring instrument on only an adhesive resin composition from which the fused silica and nickel particles were removed.

Next, using the adhesive film c thus obtained, a chip (10 mm×10 mm; thickness: 0.5 mm) with gold bumps (area: 80 μm×80 μm each; space: 30 μm; height: 15 μm; the number of bumps: 288) was bonded to a Ni/Au-plated Cu circuit printed substrate (electrode height: 20 μm; thickness: 0.8 mm) in the manner as shown below.

First, the adhesive film c (12 mm×12 mm) was stuck to the Ni/Au-plated Cu circuit printed substrate at 80° C. and 10 kgf/cm². Thereafter, the separator was peeled, and the bumps of the chip were registered on the Ni/Au-plated Cu circuit printed substrate. Then, heat and pressure were applied from above the chip under conditions of 170° C., 30 g/bump and 20 seconds to effect main bonding.

Connection resistance after the main bonding was 5 mΩ at maximum per bump and 1.5 mΩ on the average, and insulation resistance was $10^8$ Ω or above. These values did not change even after 1,000-cycle treatment in a thermal shock test made at −55 to 125° C., after a PCT (121° C., 2 atmospheric pressure) made for 200 hours, and after 260° C. solder bath immersion for 10 seconds, showing good connection reliability.

Example 4

50 g of phenoxy resin and 100 g of acrylic rubber (molecular weight: 850,000) obtained by copolymerization of butyl acrylate (40 parts), ethyl acrylate (30 parts), acrylonitrile (30 parts) and glycidyl methacrylate (3 parts) were dissolved in 350 g of ethyl acetate to obtain a 30% solution.

Next, 350 g of liquid epoxy (epoxy equivalent weight: 185) containing a microcapsular latent curing agent was added to this solution, followed by stirring, where fused silica (average particle diameter: 0.5 μm) in an amount of 40 parts by weight based on 100 parts by weight of the adhesive resin composition and also 5% by volume of conductive particles obtained by forming Au layers on polystyrene cores (diameter: 5 μm) were dispersed to obtain a film coating fluid.

This film coating fluid was coated on a separator (silicone-treated polyethylene terephthalate film; thickness: 40 μm) by means of a roll coater, followed by drying at 100° C. for 10 minutes to form an adhesive film d of 45 μm thick. This adhesive film d had a modulus of elasticity at 40° C. of 1,000 MPa after curing as measured with a dynamic viscoelasticity measuring instrument on only an adhesive resin composition from which the fused silica and nickel particles were removed. In addition, the adhesive film d had an average coefficient of thermal expansion at 110 to 130° C. of 111 ppm as measured by the TMA method.

Next, using the adhesive film d thus obtained, a chip (1.7 mm×17 mm; thickness: 0.5 mm) with gold bumps (area: 50 μm×50 μm each; 362 bumps; space: 20 μm; height: 15 μm) was bonded to a glass substrate (thickness: 1.1 mm) with an ITO (yttrium tin oxide) circuit in the manner as shown below.

First, the adhesive film c (12 mm×12 mm) was stuck to the glass substrate with an ITO circuit at 80° C. and 10 kgf/cm². Thereafter, the separator was peeled, and the bumps of the chip were registered on the glass substrate with an ITO circuit. Then, heat and pressure were applied from above the chip under conditions of 180° C., 40 g/bump and 20 seconds to effect main bonding.

Connection resistance after the main bonding was 150 mΩ at maximum per bump and 80 mΩ on the average, and insulation resistance was $10^8$ Ω or above. These values did not change even after 1,000-cycle treatment in a thermal shock test made at −40 to 100° C. and after a PCT (105° C., 1.2 atmospheric pressure) made for 100 hours, showing good connection reliability.

Example 5

50 g of phenoxy resin and 125 g of acrylic rubber (molecular weight: 850,000) obtained by copolymerization of butyl acrylate (40 parts), ethyl acrylate (30 parts), acrylonitrile (30 parts) and glycidyl methacrylate (3 parts) were dissolved in 400 g of ethyl acetate to obtain a 30% solution.

Next, 325 g of liquid epoxy (epoxy equivalent weight: 185) containing a microcapsular latent curing agent was added to this solution, followed by stirring, where fused silica (average particle diameter: 0.5 μm) in an amount of 60 parts by weight based on 100 parts by weight of the adhesive resin composition and also 2% by volume of nickel particles (diameter: 5 μm) were dispersed to obtain a film coating fluid.

This film coating fluid was coated on a separator (silicone-treated polyethylene terephthalate film; thickness: 40 μm) by means of a roll coater, followed by drying at 100° C. for 10 minutes to form an adhesive film e of 45 μm thick. This adhesive film e had a modulus of elasticity at 40° C. of 800 MPa after curing as measured with a dynamic viscoelasticity measuring instrument on only an adhesive resin composition from which the fused silica and nickel particles were removed.

Next, using the adhesive film e thus obtained, a bumpless chip (10 mm×10 mm; thickness: 0.5 mm; pad electrode: Al; pad diameter: 120 μm) was bonded to a Ni/Au-plated Cu circuit printed substrate on the circuit of which Ni/Au-plated Cu bumps (diameter: 100 μm; space: 50 μm; height: 15 μm; the number of bumps: 200) were formed, which was bonded in the manner as shown below.

First, the adhesive film e (12 mm×12 mm) was stuck to the Ni/Au-plated Cu circuit printed substrate (electrode height: 20 μm; thickness: 0.8 mm) at 80° C. and 10 kgf/cm². Thereafter, the separator was peeled, and the Al pads of the chip were registered on the Ni/Au-plated Cu circuit printed substrate (thickness: 0.8 mm) with Ni/Au-plated Cu bumps. Then, heat and pressure were applied from above the chip under conditions of 180° C., 30 g/bump and 20 seconds to effect main bonding.

Connection resistance after the main bonding was 8 mΩ at maximum per bump and 4 mΩ on the average, and insulation resistance was $10^8$ Ω or above. These values did not change even after 1,000-cycle treatment in a thermal shock test made at −55 to 125° C., after a PCT (121° C., 2 atmospheric pressure) made for 200 hours, and after 260° C. solder bath immersion for 10 seconds, showing good connection reliability.

Example 6

50 g of phenoxy resin and 125 g of acrylic rubber (molecular weight: 850,000) obtained by copolymerization of butyl acrylate (40 parts), ethyl acrylate (30 parts), acrylonitrile (30 parts) and glycidyl methacrylate (3 parts) were dissolved in 400 g of ethyl acetate to obtain a 30% solution.

Next, 325 g of liquid epoxy (epoxy equivalent weight: 185) containing a microcapsular latent curing agent was added to this solution, followed by stirring, where fused silica (average particle diameter: 0.5 μm) in an amount of 40 parts by weight based on 100 parts by weight of the adhesive resin composition was dispersed to obtain a film coating fluid.

This film coating fluid was coated on a separator (silicone-treated polyethylene terephthalate film; thickness: 40 μm) by means of a roll coater, followed by drying at 100° C. for 10 minutes to form a first adhesive layer, adhesive film f (thickness: 25 μm). This adhesive film f had a modulus of elasticity at 40° C. of 800 MPa after curing as measured with a dynamic viscoelasticity measuring instrument on only an adhesive resin composition from which the fused silica was removed.

A second adhesive layer, adhesive film g (thickness: 25 μm) was also formed in the same manner as the formation of the adhesive film g except that 2% by volume of nickel particles (diameter: 3 μm) were dispersed in place of the dispersing of the fused silica. The resultant adhesive film g had a modulus of elasticity at 40° C. of 800 MPa.

Next, the adhesive film f and adhesive film g thus obtained were laminated to obtain a composite film, laminated film adhesive h.

Using this laminated film adhesive h, a chip (10 mm×10 mm; thickness: 0.5 mm) with gold bumps (area: 80 μm×80 μm each; space: 30 μm; height: 15 μm; the number of bumps: 288) was bonded to a Ni/Au-plated Cu circuit printed substrate in the manner as shown below.

First, the adhesive film g (second adhesive layer) of this laminated film adhesive h (12 mm×12 mm) was stuck to the Ni/Au-plated Cu circuit printed substrate (electrode height: 20 μm; thickness: 0.8 mm) at 80° C. and 10 kgf/cm². Thereafter, the separator was peeled, and the chip was faced on the side of the adhesive film f (first adhesive layer), where the bumps of the chip were registered on the Ni/Au-plated Cu circuit printed substrate (thickness: 0.8 mm). Then, heat and pressure were applied from above the chip under conditions of 180° C., 50 g/bump and 20 seconds to effect main bonding.

Connection resistance after the main bonding was 6 mΩ at maximum per bump and 2 mΩ on the average, and insulation resistance was $10^8$ Ω or above. These values did not change even after 1,000-cycle treatment in a thermal shock test made at −55 to 125° C., after a PCT (121° C., 2 atmospheric pressure) made for 200 hours, and after 260° C. solder bath immersion for 10 seconds, showing good connection reliability.

Example 7

50 g of phenoxy resin and 175 g of acrylic rubber (molecular weight: 850,000) obtained by copolymerization of butyl acrylate (40 parts), ethyl acrylate (30 parts), acrylonitrile (30 parts) and glycidyl methacrylate (3 parts) were dissolved in 525 g of ethyl acetate to obtain a 30% solution.

Next, 275 g of liquid epoxy (epoxy equivalent weight: 185) containing a microcapsular latent curing agent was added to this solution, followed by stirring, where fused silica (average particle diameter: 1 μm) in an amount of 60 parts by weight based on 100 parts by weight of the adhesive resin composition was dispersed to obtain a film coating fluid.

This film coating fluid was coated on a separator (silicone-treated polyethylene terephthalate film; thickness: 40 μm) by means of a roll coater, followed by drying at 100° C. for 10 minutes to form an adhesive film i (thickness: 20 μm) corresponding to the first adhesive layer. This adhesive film i had a modulus of elasticity at 40° C. of 400 MPa after curing as measured with a dynamic viscoelasticity measuring instrument on only an adhesive resin composition from which the fused silica was removed.

An adhesive film j (thickness: 20 μm) corresponding to the second adhesive layer was also formed in the same manner as the formation of the adhesive film i except that 2% by volume of nickel particles (diameter: 5 μm) were dispersed in place of the dispersing of the fused silica. The resultant adhesive film j had a modulus of elasticity at 40° C. of 400 MPa.

Next, the adhesive film i and adhesive film j thus obtained were laminated to obtain a composite film, laminated film adhesive k. Using this laminated film adhesive k, a chip (10 mm×10 mm; thickness: 0.5 mm) with gold bumps (area: 80 μm×80 μm each; space: 30 μm; height: 15 μm; the number of bumps: 288) was bonded to a Ni/Au-plated Cu circuit printed substrate in the manner as shown below.

First, the adhesive film j (second adhesive layer) of this laminated film adhesive k (12 mm×12 mm) was stuck to the Ni/Au-plated Cu circuit printed substrate (electrode height: 20 μm; thickness: 0.8 mm) at 80° C. and 10 kgf/cm². Thereafter, the separator was peeled, and the chip was faced on the side of the adhesive film i (first adhesive layer), where the bumps of the chip were registered on the Ni/Au-plated Cu circuit printed substrate (thickness: 0.8 mm). Then, heat and pressure were applied from above the chip under conditions of 180° C., 50 g/bump and 20 seconds to effect main bonding.

Connection resistance after the main bonding was 18 mΩ at maximum per bump and 8 mΩ on the average, and insulation resistance was 108 Ω or above. These values did not change even after 1,000-cycle treatment in a thermal shock test made at −55 to 125° C., after a PCT (121° C., 2 atmospheric pressure) made for 200 hours, and after 260° C. solder bath immersion for 10 seconds, showing good connection reliability.

Example 8

50 g of phenoxy resin and 100 g of acrylic rubber (molecular weight: 850,000) obtained by copolymerization of butyl acrylate (40 parts), ethyl acrylate (30 parts), acrylonitrile (30 parts) and glycidyl methacrylate (3 parts) were dissolved in 350 g of ethyl acetate to obtain a 30% solution.

Next, 350 g of liquid epoxy (epoxy equivalent weight: 185) containing a microcapsular latent curing agent was added to this solution, followed by stirring, where fused silica (average particle diameter: 0.5 μm) in an amount of 60 parts by weight based on 100 parts by weight of the adhesive resin composition was dispersed to obtain a film coating fluid.

This film coating fluid was coated on a separator (silicone-treated polyethylene terephthalate film; thickness: 40 μm) by means of a roll coater, followed by drying at 100° C. for 10 minutes to form an adhesive film m (thickness: 25 μm) corresponding to the first adhesive layer. This adhesive film m had a modulus of elasticity at 40° C. of 1,000 MPa after curing as measured with a dynamic viscoelasticity measuring instrument on only an adhesive resin composition from which the fused silica was removed.

An adhesive film n (thickness: 25 μm) corresponding to the second adhesive layer was also formed in the same manner as the formation of the adhesive film m except that 5% by volume of conductive particles obtained by forming Au layers on polystyrene cores (diameter: 5 μm) were dispersed in place of the dispersing of the fused silica. The resultant adhesive film n had a modulus of elasticity at 40° C. of 1,000 MPa.

Next, the adhesive film m and adhesive film n thus obtained were laminated to obtain a composite film, laminated film adhesive p. Using this laminated film adhesive p, a chip (10 mm×10 mm; thickness: 0.5 mm) with gold bumps (area: 80 μm×80 μm each; space: 30 μm; height: 15 μm; the number of bumps: 288) was bonded to a Ni/Au-plated Cu circuit printed substrate in the manner as shown below.

First, the adhesive film n (second adhesive layer) of this laminated film adhesive p (12 mm×12 mm) was stuck to the Ni/Au-plated Cu circuit printed substrate (electrode height: 20 μm; thickness: 0.8 mm) at 80° C. and 10 kgf/cm². Thereafter, the separator was peeled, and the chip was faced on the side of the adhesive film m (first adhesive layer), where the bumps of the chip were registered on the Ni/Au-plated Cu circuit printed substrate (thickness: 0.8 mm). Then, heat and pressure were applied from above the chip under conditions of 180° C., 50 g/bump and 20 seconds to effect main bonding.

Connection resistance after the main bonding was 5 mΩ at maximum per bump and 1.5 mΩ on the average, and insulation resistance was $10^8$ Ω or above. These values did not change even after 1,000-cycle treatment in a thermal shock test made at −55 to 125° C., after a PCT (121° C., 2 atmospheric pressure) made for 200 hours, and after 260° C. solder bath immersion for 10 seconds, showing good connection reliability.

Example 9

50 g of phenoxy resin and 125 g of acrylic rubber (molecular weight: 850,000) obtained by copolymerization of butyl acrylate (40 parts), ethyl acrylate (30 parts), acrylonitrile (30 parts) and glycidyl methacrylate (3 parts) were dissolved in 400 g of ethyl acetate to obtain a 30% solution.

Next, 325 g of liquid epoxy (epoxy equivalent weight: 185) containing a microcapsular latent curing agent was added to this solution, followed by stirring, where fused silica (average particle diameter: 0.5 μm) in an amount of 60 parts by weight based on 100 parts by weight of the adhesive resin composition was dispersed to obtain a film coating fluid.

This film coating fluid was coated on a separator (silicone-treated polyethylene terephthalate film; thickness: 25 μm) by means of a roll coater, followed by drying at 100° C. for 10 minutes to form an adhesive film q (thickness: 25 μm) corresponding to the first adhesive layer. This adhesive film q had a modulus of elasticity at 40° C. of 800 Mpa after curing as measured with a dynamic viscoelasticity measuring instrument on only an adhesive resin composition from which the fused silica was removed.

An adhesive film r (thickness: 25 μm) corresponding to the second adhesive layer was also formed in the same manner as the formation of the adhesive film q except that 2% by volume of nickel particles (diameter: 3 μm) were dispersed in place of the dispersing of the fused silica. The resultant adhesive film r had a modulus of elasticity at 40° C. of 800 MPa.

Next, the adhesive film q and adhesive film r thus obtained were laminated to obtain a composite film, laminated film adhesive s.

Using this laminated film adhesive s, a bumpless chip (10 mm×10 mm; thickness: 0.5 mm; pad electrode: Al; pad diameter: 120 μm) was bonded to a Ni/Au-plated Cu circuit printed substrate on the circuit of which Ni/Au-plated Cu bumps (diameter: 100 μm; space: 50 μm; height: 15 μm; the number of bumps: 200) were formed, which was bonded in the manner as shown below.

First, the adhesive film r (second adhesive layer) of this laminated film adhesive s (12 mm×12 mm) was stuck at 80° C. and 10 kgf/cm², to the Ni/Au-plated Cu circuit printed substrate on which Ni/Au-plated Cu bumps (diameter: 100 μm; space: 50 μm; height: 15 μm; the number of bumps: 200) were formed. Thereafter, the separator was peeled, and the chip was faced on the side of the adhesive film q (first adhesive layer), where the bumps of the chip were registered on the Ni/Au-plated Cu circuit printed substrate (thickness: 0.8 mm). Then, heat and pressure were applied from above the chip under conditions of 180° C., 50 g/bump and 20 seconds to effect main bonding.

Connection resistance after the main bonding was 8 mΩ at maximum per bump and 4 mΩ on the average, and insulation resistance was $10^8$ Ω or above. These values did not change even after 1,000-cycle treatment in a thermal shock test made at −55 to 125° C., after a PCT (121° C., 2 atmospheric pressure) made for 200 hours, and after 260° C. solder bath immersion for 10 seconds, showing good connection reliability.

Example 10

195 g of phenoxy resin and 130 g of polyfunctional epoxy resin (epoxy equivalent weight: 212) were dissolved in 1,083 g of ethyl acetate to obtain a 30% solution.

Next, 325 g of liquid epoxy (epoxy equivalent weight: 185) containing a microcapsular latent curing agent was added to this solution, followed by stirring, where 2% by volume of nickel particles (diameter: 5 μm) was also dispersed to obtain a film coating fluid.

This film coating fluid was coated on a separator (silicone-treated polyethylene terephthalate film; thickness: 40 μm) by means of a roll coater, followed by drying at 100° C. for 10 minutes to form an adhesive film t (thickness: 25 μm) corresponding to the third adhesive layer. This adhesive film t had a coefficient of thermal expansion of 45 ppm at 30 to 100° C. after curing, a glass transition temperature of 150° C. and a modulus of elasticity at 40° C. of 2,600 MPa.

50 g of phenoxy resin and 100 g of acrylic rubber (molecular weight: 850,000) obtained by copolymerization of butyl acrylate (40 parts), ethyl acrylate (20 parts), acrylonitrile (30 parts) and glycidyl methacrylate (3 parts) were also dissolved in 500 g of ethyl acetate to obtain a 30% solution.

Next, 350 g of liquid epoxy (epoxy equivalent weight: 185) containing a microcapsular latent curing agent was added to this solution, followed by stirring, where 2% by volume of nickel particles (diameter: 5 μn) was also dispersed to obtain a film coating fluid.

This film coating fluid was coated on a separator (silicone-treated polyethylene terephthalate film; thickness: 40 μm) by means of a roll coater, followed by drying at 100° C. for 10 minutes to form an adhesive film u (thickness: 25 μm) corresponding to the fourth adhesive layer. This adhesive film u had a coefficient of thermal expansion of 70 ppm at 30 to 100° C. after curing, a glass transition temperature of 125° C. and a modulus of elasticity at 40° C. of 1,000 MPa.

Next, the adhesive film t and adhesive film u thus obtained were laminated to obtain a composite film, laminated film adhesive v (thickness: 50 μm).

Then, using this laminated film adhesive v, a chip (size: 10 mm×10 mm; thickness: 0.55 mm) with gold bumps (height: 30 μm; the number of bumps: 184) was bonded to a Ni/Au-plated Cu circuit printed substrate (electrode height: 20 μm; substrate thickness: 0.8 mm) in the manner as shown below.

First, the adhesive film u (fourth adhesive layer) of this laminated film adhesive v (size: 12 mm×12 mm) was provisionally bonded to the Ni/Au-plated Cu circuit printed substrate with the adhesive film u's face set on the side of the printed substrate, under conditions of 60° C. and 0.5 MPa. After the step of provisional bonding, the bumps of the chip were registered on the Ni/Au-plated Cu circuit printed substrate, and the chip was mounted on the laminated film adhesive v. Subsequently, heat and pressure were applied from above the chip under conditions of 180° C., 50 g/bump and 20 seconds to effect main bonding.

Connection resistance after the main bonding was 10 mΩ at maximum per bump and 2 mΩ on the average, and insulation resistance was $10^8$ Ω or above. These values did not change during continuous (in situ) measurement of resistance in the course of a 1,000-cycle thermal shock test made at −55 to 125° C. and a PCT made for 500 hours at 110° C. and 85% RH, showing a good connection reliability.

Example 11

195 g of phenoxy resin and 130 g of polyfunctional epoxy resin (epoxy equivalent weight: 212) were dissolved in 1,083 g of ethyl acetate to obtain a 30% solution.

Next, 325 g of liquid epoxy (epoxy equivalent weight: 185) containing a microcapsular latent curing agent was added to this solution, followed by stirring, where fused silica (average particle diameter: 0.5 μm) in an amount of 20 parts by weight based on 100 parts by weight of the adhesive resin composition and also 2% by volume of nickel particles (diameter: 5 μm) were dispersed to obtain a film coating fluid.

This film coating fluid was coated on a separator (silicone-treated polyethylene terephthalate film; thickness: 40 μm) by means of a roll coater, followed by drying at 100° C. for 10 minutes to form an adhesive film w (thickness: 25 μm) corresponding to the third adhesive layer. This adhesive film w had a coefficient of thermal expansion of 38 ppm at 30 to 100° C. after curing, a glass transition temperature of 153° C. and a modulus of elasticity at 40° C. of 3,000 MPa.

50 g of phenoxy resin and 100 g of acrylic rubber (molecular weight: 850,000) obtained by copolymerization of butyl acrylate (40 parts), ethyl acrylate (20 parts), acrylonitrile (30 parts) and glycidyl methacrylate (3 parts) were also dissolved in 500 g of ethyl acetate to obtain a 30% solution.

Next, 350 g of liquid epoxy (epoxy equivalent weight: 185) containing a microcapsular latent curing agent was added to this solution, followed by stirring, where fused silica (average particle diameter: 0.5 μm) in an amount of 20 parts by weight based on 100 parts by weight of the adhesive resin composition and also 2% by volume of nickel particles (diameter: 5 μm) were dispersed to obtain a film coating fluid.

This film coating fluid was coated on a separator (silicone-treated polyethylene terephthalate film; thickness: 40 μm) by means of a roll coater, followed by drying at 100° C. for 10 minutes to form an adhesive film x (thickness: 25 μm) corresponding to the fourth adhesive layer. This adhesive film x had a coefficient of thermal expansion of 60 ppm at 30 to 100° C. after curing, a glass transition temperature of 127° C. and a modulus of elasticity at 40° C. of 1,400 MPa.

Next, the adhesive film w and adhesive film x thus obtained were laminated to obtain a composite film, laminated film adhesive y (thickness: 50 μm).

Then, using this laminated film adhesive y, a chip (size: 10 mm×10 mm; thickness: 0.55 mm) with gold bumps (height: 30 μm; the number of bumps: 184) was bonded to a Ni/Au-plated Cu circuit printed substrate (electrode height: 20 μm; substrate thickness: 0.8 mm) in the manner as shown below.

The adhesive film x (fourth adhesive layer) of this laminated film adhesive y (size: 12 mm×12 mm) was provisionally bonded to the Ni/Au-plated Cu circuit printed substrate with the adhesive film x's face set on the side of the printed substrate, under conditions of 60° C. and 0.5 MPa. After the step of provisional bonding, the bumps of the chip were registered on the Ni/Au-plated Cu circuit printed substrate, and the chip was mounted on the laminated film adhesive y. Subsequently, heat and pressure were applied from above the chip under conditions of 180° C., 50 g/bump and 20 seconds to effect main bonding.

Connection resistance after the main bonding was 10 mΩ at maximum per bump and 2 mΩ on the average, and insulation resistance was 108 Ω or above. These values did not change during continuous (in situ) measurement of resistance in the course of a 1,000-cycle thermal shock test made at −55 to 125° C. and a PCT made for 500 hours at 110° C. and 85% RH, showing good connection reliability.

Comparative Example 1

Using the laminated film adhesive v obtained in Example 10, a chip (size: 10 mm×10 mm; thickness: 0.55 mm) with gold bumps (height: 30 μm; the number of bumps: 184) was bonded to a Ni/Au-plated Cu circuit printed substrate (electrode height: 20 μm; substrate thickness: 0.8 mm) in the same manner as in Example 10 except that, in the present Comparative Example, the face of the adhesive film t (third adhesive layer) of the laminated film adhesive v (size: 12 mm×12 mm) was set on the side of the printed substrate.

Connection resistance after the main bonding was 10 mΩ at maximum per bump and 2 mΩ on the average, and insulation resistance was $10^8$ Ω or above. However, these values changed in the course of a 500-cycle thermal shock test made at −55 to 125° C. and a PCT made for 300 hours at 110° C. and 85% RH, resulting in faulty electrical conduction.

Comparative Example 2

195 g of phenoxy resin and 130 g of polyfunctional epoxy resin (epoxy equivalent weight: 212) were dissolved in 1,083 g of ethyl acetate to obtain a 30% solution.

Next, 325 g of liquid epoxy (epoxy equivalent weight: 185) containing a microcapsular latent curing agent was added to this solution, followed by stirring, where 2% by volume of nickel particles (diameter: 5 μm) was also dispersed to obtain a film coating fluid.

This film coating fluid was coated on a separator (silicone-treated polyethylene terephthalate film; thickness: 40 μm) by means of a roll coater, followed by drying at 100° C. for 10 minutes to form an adhesive film z of 50 μm thick. The adhesive film z had a coefficient of thermal expansion of 45 ppm at 30 to 100° C. after curing, a glass transition temperature of 150° C. and a modulus of elasticity at 40° C. of 2,600 MPa.

Next, using only the adhesive film z thus obtained, a chip (size: 10 mm×10 mm; thickness: 0.55 mm) with gold bumps (height: 30 µm; the number of bumps: 184) was bonded to a Ni/Au-plated Cu circuit printed substrate (electrode height: 20 µm; substrate thickness: 0.8 mm) in the manner as shown below.

First, the adhesive film z was provisionally bonded to the Ni/Au-plated Cu circuit printed substrate under conditions of 60° C. and 0.5 MPa. After the step of provisional bonding, the bumps of the chip were registered on the Ni/Au-plated Cu circuit printed substrate, and the chip was mounted on the adhesive film z. Subsequently, heat and pressure were applied from above the chip under conditions of 180° C., 50 g/bump and 20 seconds to effect main bonding.

Connection resistance after the main bonding was 10 mΩ at maximum per bump and 3 mΩ on the average, and insulation resistance was $10^8$ Ω or above. However, these values changed after a 300-cycle thermal shock test made at −55 to 125° C. and after 26° C. solder bath immersion for 10 seconds, resulting in faulty electrical conduction. As a result of cross-sectional observation of the bonded portions, separation of the adhesive film at its interface was observed at some part where the faulty electrical conduction occurred.

Comparative Example 3

50 g of phenoxy resin and 100 g of acrylic rubber (molecular weight: 850,000) obtained by copolymerization of butyl acrylate (40 parts), ethyl acrylate (20 parts), acrylonitrile (30 parts) and glycidyl methacrylate (3 parts) were also dissolved in 500 g of ethyl acetate to obtain a 30% solution.

Next, 350 g of liquid epoxy (epoxy equivalent weight: 185) containing a microcapsular latent curing agent was added to this solution, followed by stirring, where 2% by volume of nickel particles (diameter: 5 µm) was also dispersed to obtain a film coating fluid.

This film coating fluid was coated on a separator (silicone-treated polyethylene terephthalate film; thickness: 40 µm) by means of a roll coater, followed by drying at 100° C. for 10 minutes to form an adhesive film a of 25 µm thick. This adhesive film a had a coefficient of thermal expansion of 60 ppm at 30 to 100° C. after curing, a glass transition temperature of 125° C. and a modulus of elasticity at 40° C. of 1,000 MPa.

Next, using only the adhesive film α thus obtained, a chip (size: 10 mm×10 mm; thickness: 0.55 mm) with gold bumps (height: 30 µm; the number of bumps: 184) was bonded to a Ni/Au-plated Cu circuit printed substrate (electrode height: 20 µm; substrate thickness: 0.8 mm) in the manner as shown below.

First, the adhesive film a was provisionally bonded to the Ni/Au-plated Cu circuit printed substrate under conditions of 60° C. and 0.5 MPa. After the step of provisional bonding, the bumps of the chip were registered on the Ni/Au-plated Cu circuit printed substrate, and the chip was mounted on the adhesive film α. Subsequently, heat and pressure were applied from above the chip under conditions of 180° C., 50 g/bump and 20 seconds to effect main bonding.

Connection resistance after the main bonding was 10 mΩ at maximum per bump and 2 mΩ on the average, and insulation resistance was $10^8$ Ω or above. However, these values changed during a high-temperature thermal shock test in a 30-cycle thermal shock test made at −55 to 125° C., so that the electrical conduction became poor.

POSSIBILITY OF INDUSTRIAL APPLICATION

As described above, the present invention enables production of circuit boards that may cause neither increase in connection resistance at bonded portions nor separation at adhesive layers and have greatly improved in connection reliability.

The invention claimed is:

1. An adhesive film for bonding circuit members, said adhesive film adapted to be put between circuit electrodes facing each other, with said circuit electrodes facing each other being pressed interposing the adhesive film between them, to interconnect the electrodes electrically in the direction of pressing, wherein said adhesive film comprises:
a first adhesive layer which includes an adhesive resin composition and an insulative inorganic filler;
said insulative inorganic filler being contained in an amount of from 10 to 200 parts by weight based on 100 parts by weight of the adhesive resin composition;
said adhesive film having an average coefficient of thermal expansion of 200 ppm/° C. or below at 110 to 130° C. after curing; and
the adhesive film further comprising conductive particles in an amount of from 0.1 to 30 parts by volume based on 100 parts by volume of the adhesive resin composition.

2. An adhesive film for bonding circuit members according to claim 1, said adhesive film further comprising a second adhesive layer containing an adhesive resin composition as a main ingredient.

3. An adhesive film for bonding circuit members according to claim 1, said adhesive film further comprising a second adhesive layer containing an adhesive resin composition as a main ingredient and having a modulus of elasticity of from 100 to 2,000 MPa at 40° C. after curing.

4. The adhesive film for bonding circuit members according to claim 1, which has an average coefficient of thermal expansion of from 30 to 200 ppm/° C. at 110 to 130° C. after curing of the adhesive film.

5. An adhesive film for bonding circuit members, said adhesive film adapted to be put between circuit electrodes facing each other; said circuit electrodes facing each other being pressed interposing the adhesive between them, to interconnect the electrodes electrically in the direction of pressing, wherein said adhesive film comprises:
a multi-layer constitution having a third adhesive layer and a fourth adhesive layer which have physical properties different in value from each other,
wherein said third adhesive layer has a coefficient of thermal expansion at 30° to 100° C., of from 20 to 70 ppm/° C., and
wherein at least one layer of said third and fourth adhesive layers contains an adhesive resin composition and an insulative inorganic filler in an amount of from 10 to 200 parts by weight based on 100 parts by weight of the adhesive resin composition.

6. The adhesive film for bonding circuit members according to claim 5, wherein said third adhesive layer has a modulus of elasticity after curing which is higher than the modulus of elasticity after curing of said fourth adhesive layer.

7. The adhesive film for bonding circuit members according to claim 6, wherein said fourth adhesive layer has a modulus of elasticity of from 100 to 2,000 MPa at 40° C. after curing.

8. The adhesive film for bonding circuit members according to claim 5, wherein said third adhesive layer has a coefficient of thermal expansion which is smaller than the coefficient of thermal expansion of the fourth adhesive layer.

9. The adhesive film for bonding circuit members according to claim 5, wherein said third adhesive layer has a glass transition temperature which is higher than the glass transition temperature of the fourth adhesive layer.

10. The adhesive film for bonding circuit members according to claim 9, wherein said third adhesive layer has a glass transition temperature of 120° C. or above.

11. The adhesive film for bonding circuit members according to claim 1, wherein said insulative inorganic filler has an average particle diameter of 3 μm or smaller.

12. The adhesive film for bonding circuit members according to claim 1, wherein the conductive particles have a larger average particle diameter than the average particle diameter of said insulative inorganic filler.

13. The adhesive film for bonding circuit members according to claim 1, which has a modulus of elasticity of from 30 to 2,000 MPa at 40° C. after the curing of the adhesive resin composition.

14. The adhesive film for bonding circuit members according to claim 1, wherein said adhesive resin composition contains an epoxy resin and a latent curing agent.

15. The adhesive film for bonding circuit members according to claim 1, wherein said adhesive resin composition contains an epoxy resin, an acrylic rubber and a latent curing agent.

16. The adhesive film for bonding circuit members according to claim 15, wherein said acrylic rubber contains a glycidyl ether group in the molecule.

17. An adhesive film for bonding circuit members according to claim 1, consisting of said first adhesive layer.

* * * * *